United States Patent
Aoyama et al.

(10) Patent No.: US 12,170,477 B2
(45) Date of Patent: Dec. 17, 2024

(54) POWER CONVERSION DEVICE

(71) Applicant: KABUSHIKI KAISHA TOYOTA JIDOSHOKKI, Kariya (JP)

(72) Inventors: Shuhei Aoyama, Kariya (JP); Yoshiaki Ishihara, Kariya (JP); Yuichi Noge, Fukuoka (JP)

(73) Assignee: KABUSHIKI KAISHA TOYOTA JIDOSHOKKI, Kariya (JP)

( * ) Notice: Subject to any disclaimer, the term of this patent is extended or adjusted under 35 U.S.C. 154(b) by 233 days.

(21) Appl. No.: 17/922,660

(22) PCT Filed: Apr. 28, 2021

(86) PCT No.: PCT/JP2021/017066
§ 371 (c)(1),
(2) Date: Nov. 1, 2022

(87) PCT Pub. No.: WO2021/225111
PCT Pub. Date: Nov. 11, 2021

(65) Prior Publication Data
US 2023/0268819 A1    Aug. 24, 2023

(30) Foreign Application Priority Data
May 7, 2020 (JP) ................................ 2020-081787

(51) Int. Cl.
*H02M 1/00* (2007.01)
*H02M 1/08* (2006.01)
*H02M 7/539* (2006.01)
*H02P 27/06* (2006.01)

(52) U.S. Cl.
CPC ........... *H02M 1/0054* (2021.05); *H02M 1/08* (2013.01); *H02M 7/539* (2013.01); *H02P 27/06* (2013.01)

(58) Field of Classification Search
CPC ...... H02M 1/0054; H02M 1/08; H02M 7/539; H02P 27/06
See application file for complete search history.

(56) References Cited

U.S. PATENT DOCUMENTS

| | | | |
|---|---|---|---|
| 10,833,598 B2* | 11/2020 | Umehara | F04D 25/0606 |
| 2019/0131887 A1* | 5/2019 | Mori | H02M 1/08 |
| 2020/0186076 A1* | 6/2020 | Ishimaru | H03K 17/165 |
| 2023/0223834 A1* | 7/2023 | Miki | H02M 1/38 |
| | | | 363/131 |

FOREIGN PATENT DOCUMENTS

JP    2004-048843 A    2/2004

OTHER PUBLICATIONS

International Search Report for PCT/JP2021/017066 dated Jul. 6, 2021.

* cited by examiner

Primary Examiner — Rafael O Leon De Domenech
(74) Attorney, Agent, or Firm — Sughrue Mion, PLLC

(57) ABSTRACT

A power conversion device includes two lower arm switching elements connected in parallel to each other and a lower arm driver circuit that drives the two lower arm switching elements. The two lower arm switching elements respectively include gate terminals and detection terminals used to detect counter-electromotive forces. The power conversion device includes a common connection line that connects the two detection terminals to each other and connects the two detection terminals to an addition circuit of the lower arm driver circuit. A combined electromotive force is transmitted via the common connection line.

6 Claims, 6 Drawing Sheets

POWER CONVERSION DEVICE

CROSS REFERENCE TO RELATED APPLICATIONS

This application is a National Stage of International Application No. PCT/JP2021/017066 filed Apr. 28, 2021, claiming priority based on Japanese Patent Application No. 2020-081787 filed May 7, 2020.

TECHNICAL FIELD

The present invention relates to a power conversion device.

BACKGROUND ART

Patent Literature 1 discloses an example of a driver circuit that drives an insulated-gate bipolar transistor (IGBT), which serves as a switching element. In the driver circuit disclosed in Patent Literature 1, active gate control is performed to provide feedback of induced voltage that serves as a counter-electromotive force. The counter-electromotive force is produced in an amount corresponding to the inductance of an emitter wire. The purpose of the feedback is to reduce switching loss and reduce surge voltage or surge current.

CITATION LIST

Patent Literature

Patent Literature 1: Japanese Laid-Open Patent Publication No. 2004-48843

SUMMARY OF INVENTION

Technical Problem

In the power conversion device including switching elements, for example, for a relatively large current to be supplied, the switching elements may be connected in parallel to each other and the driver circuit may be used to operate the two switching elements in synchronization.

In this configuration, the two switching elements may be controlled using the same voltage. Even in such a case, variations in the elements may cause variations to occur in the operation of switching elements, resulting in a problem in the feedback using a counter-electromotive force. As a result, reducing both the power loss and surge may be difficult. The inventors of the present application have discovered such a risk.

Accordingly, it is an objective of the present invention to provide a power conversion device that reduces both the power loss and surge even when variations occur in the operation of two switching elements connected in parallel to each other.

Solution to Problem

A power conversion device that achieves the above-described objective includes a first switching element through which a first applied current flows when the first switching element is in an ON state, a second switching element through which a second applied current flows when the second switching element is in an ON state, the second switching element being connected in parallel to the first switching element, and a driver circuit that drives the two switching elements. The first switching element includes a first control terminal, a first parasitic inductance through which the first applied current flows, and a first detection terminal used to detect a first counter-electromotive force, the first counter-electromotive force being produced by a first inductance component that includes the first parasitic inductance. The second switching element includes a second control terminal, a second parasitic inductance through which the second applied current flows, and a second detection terminal used to detect a second counter-electromotive force, the second counter-electromotive force being produced by a second inductance component that includes the second parasitic inductance. The driver circuit includes an external input terminal that receives an external command voltage, an addition circuit that outputs an added voltage, and an addition output terminal to which the added voltage is output. The power conversion device further includes a control line that connects the addition output terminal to the two control terminals and a common connection line that connects the two detection terminals to each other and connects the two detection terminals to the addition circuit. A combined electromotive force of the two counter-electromotive forces is transmitted via the common connection line. The addition circuit receives the combined electromotive force and the external command voltage, and outputs the added voltage by adding the combined electromotive force to the external command voltage.

In this configuration, the two switching elements connected in parallel to each other are operated based on the added voltage. This allows the two switching elements to be operated in synchronization. Thus, current in which the two applied currents are combined is supplied. Accordingly, as compared with when one switching element is used, a larger current is supplied.

In this configuration, the common connection line connects the two detection terminals to each other and connects the two detection terminals to the addition circuit. This allows the combined electromotive force of the two counter-electromotive forces to be used as a voltage that is fed back to the addition circuit. Accordingly, even when variations occur in the operation of the two switching elements, feedback based on the two counter-electromotive forces is given to the two switching elements. This reduces both the power loss and surge.

In the power conversion device, the driver circuit preferably includes a feedback input terminal that receives the combined electromotive force. The common connection line preferably includes a first part line that connects the two detection terminals to each other and connects the two detection terminals to the feedback input terminal and a second part line that connects the feedback input terminal to the addition circuit, the second part line being located in the driver circuit.

In this configuration, the two counter-electromotive forces are combined by the first part line into the combined electromotive force, which is input to the feedback input terminal. Then, the combined electromotive force is input to the addition circuit via the second part line. This provides the above-described advantage. Additionally, this configuration eliminates the need for the driver circuit to have two feedback input terminals that respectively the two counter-electromotive forces. As a result, the driver circuit has a simple configuration.

The power conversion device preferably includes a voltage amplifier circuit that amplifies the combined electromotive force, the voltage amplifier circuit being located on the second part line.

In this configuration, the combined electromotive force is amplified by the voltage amplifier circuit and then input to the addition circuit. Thus, even when the two inductance components produce small voltages, the combined electromotive force with a desired magnitude is input to the addition circuit.

In the power conversion device, the first switching element and the second switching element preferably include a first upper arm switching element and a second upper arm switching element connected in parallel to each other, and a first lower arm switching element and a second lower arm switching element connected in parallel to each other. A parallel connector of the first upper arm switching element and the second upper arm switching element is preferably connected in series to a parallel connector of the first lower arm switching element and the second lower arm switching element. The power conversion device further preferably includes a positive electrode busbar to which the two upper arm switching elements are connected and a negative electrode busbar to which the two lower arm switching elements are connected, the negative electrode busbar being connected to a reference potential. The driver circuit preferably includes an upper arm driver circuit that drives the two upper arm switching elements and a lower arm driver circuit that drives the two lower arm switching elements. The first counter-electromotive force with a negative voltage is preferably applied to the first detection terminal of the first lower arm switching element and the second counter-electromotive force with a negative voltage is preferably applied to the second detection terminal of the second lower arm switching element when the first lower arm switching element and the second lower arm switching element are turned off. The common connection line preferably connects the two detection terminals of the two lower arm switching elements to each other and connects the two detection terminals to the addition circuit of the lower arm driver circuit. The power conversion device preferably includes an inverting circuit that inverts the combined electromotive force, the inverting circuit being located on the common connection line. The addition circuit preferably receives the combined electromotive force that has been inverted by the inverting circuit.

In this configuration, on the condition that the negative electrode busbar is connected to the reference potential and on the condition that the counter-electromotive forces with a positive voltage are detected when the two lower arm switching elements are turned on and the counter-electromotive forces with a negative voltage are detected when the two lower arm switching elements are turned off, feedback using the counter-electromotive forces is given to the two lower arm switching elements.

A power conversion device that achieves the above-described objective includes a first switching element through which a first applied current flows when the first switching element is in an ON state, a second switching element through which a second applied current flows when the second switching element is in an ON state, the second switching element being connected in parallel to the first switching element, and a driver circuit that drives the two switching elements. The first switching element includes a first control terminal and a first output terminal. The second switching element includes a second control terminal and a second output terminal. The driver circuit includes an external input terminal that receives an external command voltage, an addition circuit that outputs an added voltage, and an addition output terminal to which the added voltage is output. The power conversion device further includes a control line that connects the addition output terminal to the two control terminals and a detection line including an inductance, the detection line connecting the two output terminals to each other, and the detection line connecting the output terminals to the addition circuit such that the addition circuit receives a counter-electromotive force produced by the inductance. The addition circuit receives the counter-electromotive force and the external command voltage, and outputs the added voltage by adding the counter-electromotive force to the external command voltage.

In this configuration, even when variations occur in the operation of the two switching elements, feedback is given to the two switching elements. This reduces both the power loss and surge. Further, the switching elements do not need to include detection terminals.

In the power conversion device, the detection line is preferably a wiring pattern located on a board.

Advantageous Effects of Invention

In this invention, even when variations occur in the operation of two switching elements connected in parallel to each other, the power loss and surge are both reduced.

DESCRIPTION OF EMBODIMENTS

First Embodiment

A power conversion device according to an embodiment will now be described.

A power conversion device 10 of the present embodiment is mounted in, for example, a vehicle 200 and used to drive an electric motor 201 disposed in the vehicle 200.

More specifically, the electric motor 201 of the present embodiment is a travel motor used to rotate the wheels of the vehicle 200. The electric motor 201 of the present embodiment includes three-phase coils 202u, 202v, 202w. The three-phase coils 202u, 202v, 202w are connected together to form, for example, a Y-connection. Energizing the three-phase coils 202u, 202v, 202w in a predetermined pattern rotates the electric motor 201. The three-phase coils 202u, 202v, 202w do not have to be connected together to form a Y-connection. Instead, the three-phase coils 202u, 202v, 202w may be connected together to form, for example, a delta connection.

Figure 1:
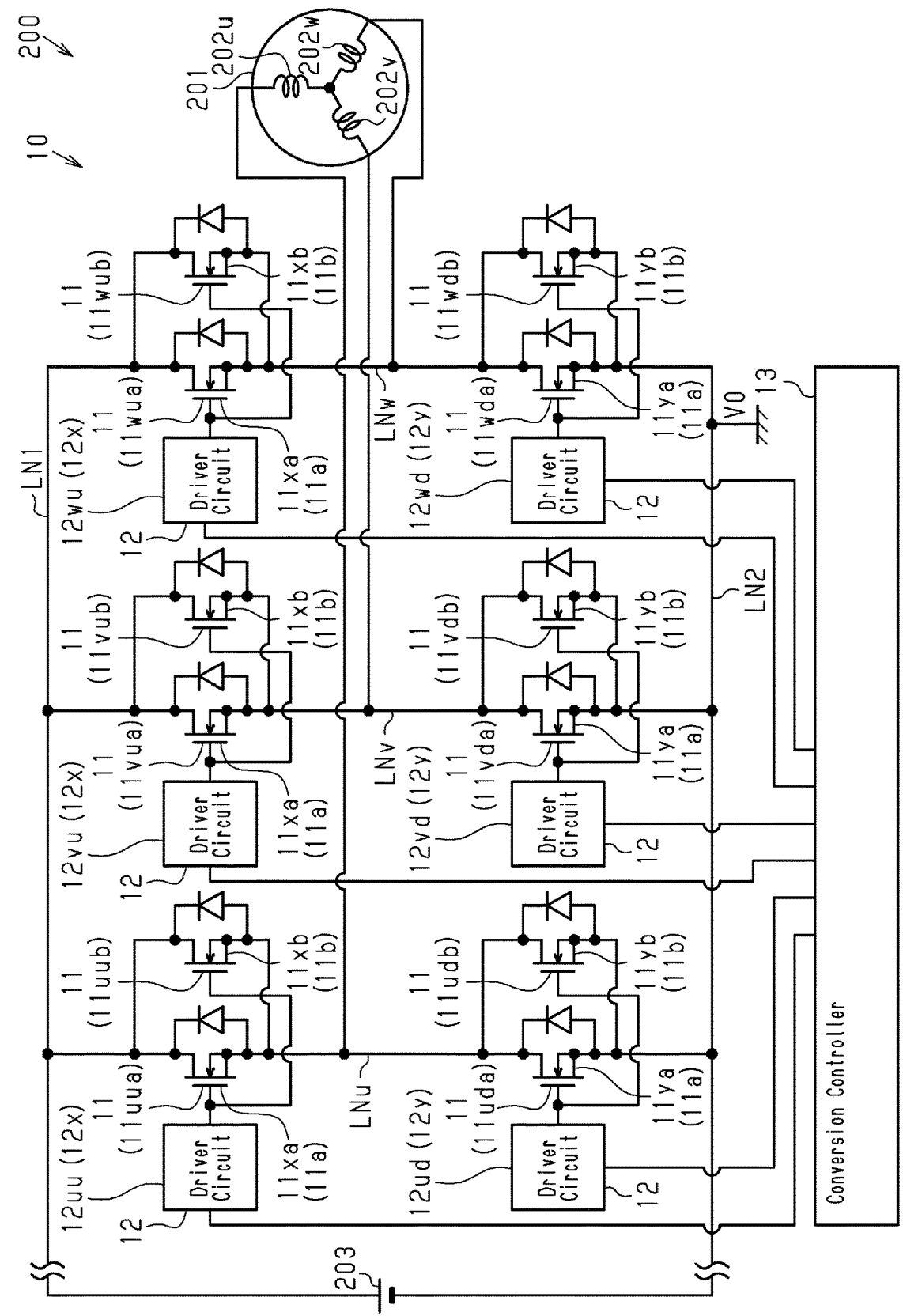
FIG. 1 is a circuit diagram schematically showing the electric configuration of a power conversion device according to a first embodiment.

As shown in FIG. 1, the vehicle 200 includes a power storage device 203. The power conversion device 10 of the present embodiment is an inverter device that converts direct-current power of the power storage device 203 into alternating-current power capable of driving the electric motor 201. In other words, the power conversion device 10 is a driving device that drives the electric motor 201 using the power storage device 203.

The power conversion device 10 includes a switching element 11. The switching element 11 is, for instance, a power switching element (e.g., power metal-oxide-semiconductor field-effect transistor (MOSFET)). The switching element 11 includes a freewheeling diode connected anti-parallel. The freewheeling diode is, for example, a parasitic diode in the switching element 11. Instead, the freewheeling diode may be separate from the switching element 11.

The power conversion device 10 of the present embodiment includes multiple switching elements 11. More specifically, the switching elements 11 of the power conversion device 10 include u-phase upper arm switching elements 11uua, 11uub and u-phase lower arm switching elements 11uda, 11udb, which correspond to a u-phase coil 202u. The two u-phase upper arm switching elements 11uua, 11uub are connected in parallel to each other. The two u-phase lower arm switching elements 11uda, 11udb are connected in parallel to each other. A parallel connector of the two u-phase upper arm switching elements 11uua, 11uub and a parallel connector of the two u-phase lower arm switching elements 11uda, 11udb are connected in series to each other by a u-phase connection line LNu. The u-phase connection line LNu is connected to the u-phase coil 202u.

Likewise, the switching elements 11 of the power conversion device 10 include v-phase upper arm switching elements 11vua, 11vub and v-phase lower arm switching elements 11vda, 11vdb, which correspond to a v-phase coil 202v. The two v-phase upper arm switching elements 11vua, 11vub are connected in parallel to each other. The two v-phase lower arm switching elements 11vda, 11vdb are connected in parallel to each other. A parallel connector of the two v-phase upper arm switching elements 11vua, 11vub and a parallel connector of the two v-phase lower arm switching elements 11vda, 11vdb are connected in series to each other by a v-phase connection line LNv. The v-phase connection line LNv is connected to the v-phase coil 202v.

The switching elements 11 of the power conversion device 10 include w-phase upper arm switching elements 11wua, 11wub and w-phase lower arm switching elements 11wda, 11wdb, which correspond to a w-phase coil 202w. The two w-phase upper arm switching elements 11wua, 11wub are connected in parallel to each other. The two w-phase lower arm switching elements 11wda, 11wdb are connected in parallel to each other. A parallel connector of the two w-phase upper arm switching elements 11wua, 11wub and a parallel connector of the two w-phase lower arm switching elements 11wda, 11wdb are connected in series to each other by a w-phase connection line LNw. The w-phase connection line LNw is connected to the w-phase coil 202w.

Hereinafter, the u-phase upper arm switching elements 11uua, 11uub, v-phase upper arm switching elements 11vua, 11vub, and w-phase upper arm switching elements 11wua, 11wub are also simply referred to as the upper arm switching elements 11xa, 11xb to facilitate understanding. The u-phase lower arm switching elements 11uda, 11udb, v-phase lower arm switching elements 11vda, 11vdb, and w-phase lower arm switching elements 11wda, 11wdb are also simply referred to as the lower arm switching elements 11ya, 11yb to facilitate understanding.

The power conversion device 10 includes a positive electrode busbar LN1 to which the two upper arm switching elements 11xa, 11xb are connected and a negative electrode busbar LN2 to which the two lower arm switching elements 11ya, 11yb are connected. The positive electrode busbar LN1 is connected to a positive electrode terminal (plus terminal) of the power storage device 203 on a high-voltage side. The negative electrode busbar LN2 is connected to a negative electrode terminal (minus terminal) of the power storage device 203 on a low-voltage side. That is, a serial connector of the upper arm switching elements 11xa, 11xb and the lower arm switching elements 11ya, 11yb is connected to the positive electrode busbar LN1 and the negative electrode busbar LN2 and supplied with direct-current power from the power storage device 203. In the present embodiment, the negative electrode busbar LN2 is connected to a reference potential V0. Thus, the lower arm switching elements 11ya, 11yb are connected to the reference potential V0.

Figure 2:
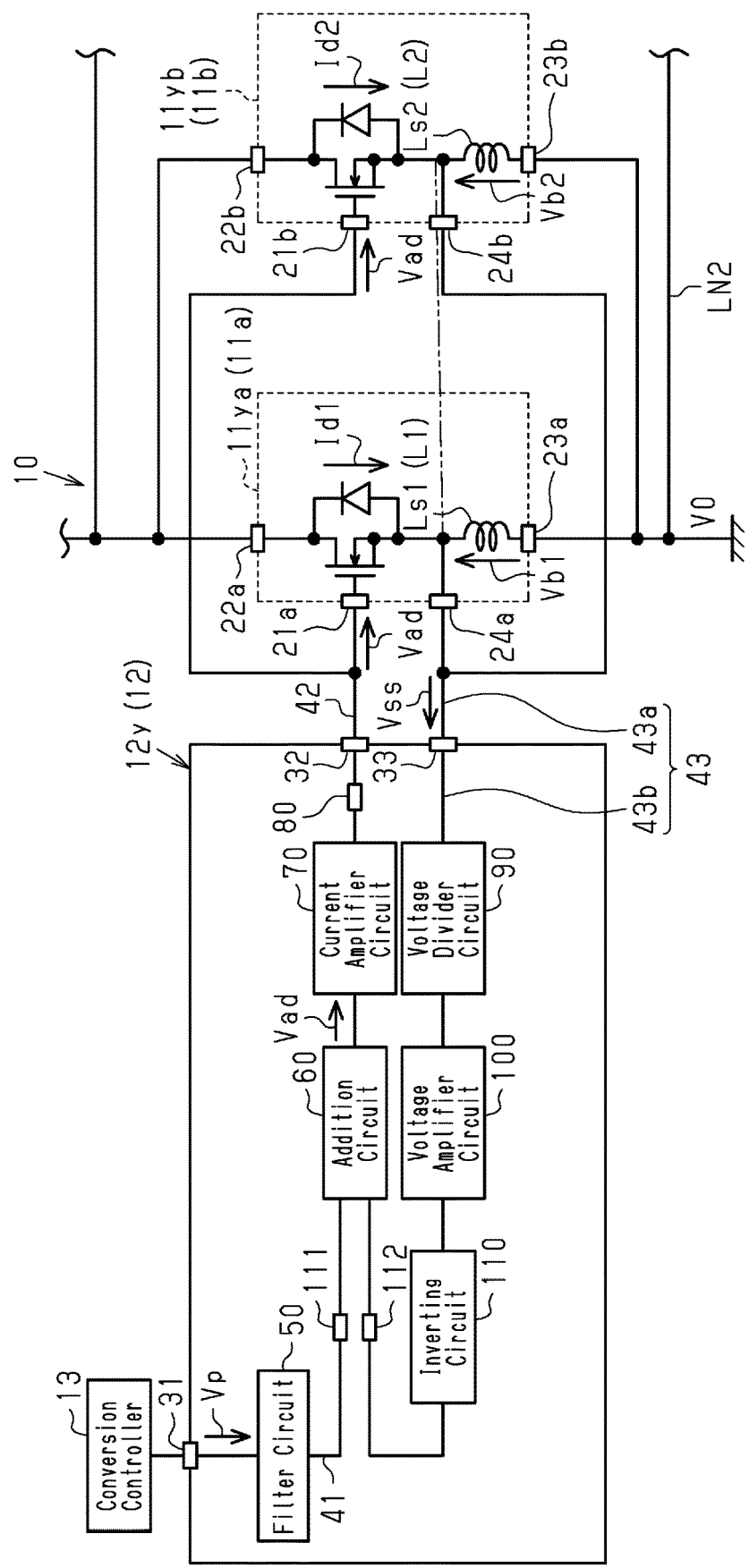
FIG. 2 is a block circuit diagram showing the electric configuration of the lower arm driver circuit and the two lower arm switching elements.

As shown in FIGS. 1 and 2, the power conversion device 10 includes a driver circuit 12 that drives the switching element 11.

The driver circuit 12 of the present embodiment is a gate driver circuit. The power conversion device 10 of the present embodiment includes multiple driver circuits 12 in correspondence with multiple switching elements 11. More specifically, the power conversion device 10 includes a u-phase upper arm driver circuit 12uu that drives the two u-phase upper arm switching elements 11uua, 11uub and a u-phase lower arm driver circuit 12ud that drives the two u-phase lower arm switching elements 11uda, 11udb.

The u-phase upper arm driver circuit 12uu is connected to gates of the two u-phase upper arm switching elements 11uua, 11uub. The u-phase upper arm driver circuit 12uu turns on or off the two u-phase upper arm switching elements 11uua, 11uub by controlling the gate voltage. In the present embodiment, the u-phase upper arm driver circuit 12uu outputs the same gate voltage to the two u-phase upper arm switching elements 11uua, 11uub. Thus, the two u-phase upper arm switching elements 11uua, 11uub are synchronized.

Likewise, the u-phase lower arm driver circuit 12ud is connected to gates of the two u-phase lower arm switching elements 11uda, 11udb. The u-phase lower arm driver circuit 12ud outputs the same gate voltage to the two u-phase lower arm switching elements 11uda, 11udb. This causes the u-phase lower arm switching elements 11uda, 11udb to be switched in synchronization.

The power conversion device 10 includes a v-phase upper arm driver circuit 12vu that drives the v-phase upper arm switching elements 11vua, 11vub and a v-phase lower arm driver circuit 12vd that drives the v-phase lower arm switching elements 11vda, 11vdb. The power conversion device 10 includes a w-phase upper arm driver circuit 12wu that drives the w-phase upper arm switching elements 11wua, 11wub and a w-phase lower arm driver circuit 12wd that drives the w-phase lower arm switching elements 11wda, 11wdb. These configurations are the same as those of the u-phase upper arm driver circuit 12uu and the u-phase lower arm driver circuit 12ud and thus will not be described in detail.

Hereinafter, the upper arm driver circuits 12*uu*, 12*vu*, 12*wu* and the lower arm driver circuits 12*ud*, 12*vd*, 12*wd* are simply referred to as the upper arm driver circuit 12*x* and the lower arm driver circuit 12*y*, respectively, to facilitate understanding.

As shown in FIG. 1, the vehicle 200 includes a conversion controller 13 that controls the power conversion device 10. The conversion controller 13 of the present embodiment is an inverter controller. Based on a command (e.g., requested rotation speed) from an external device, the conversion controller 13 determines a target current that flows through the electric motor 201 and obtains an external command voltage Vp at which the target current flows. Then, the conversion controller 13 outputs the external command voltage Vp to the driver circuits 12.

In the present embodiment, the conversion controller 13 obtains the external command voltage Vp for each of the driver circuits 12*uu* to 12*wd* and outputs each external command voltage Vp to the corresponding one of the driver circuits 12*uu* to 12*wd*. This allows the upper arm switching elements 11*xa*, 11*xb* and the lower arm switching elements 11*ya*, 11*yb* of each phase to be controlled individually.

The switching elements 11 and the driver circuits 12 will now be described in detail with reference to FIGS. 2 and 3. The upper-arm configuration is fundamentally the same as the lower-arm configuration. Thus, the lower arm switching elements 11*ya*, 11*yb* and the lower arm driver circuit 12*y* will be described in detail to facilitate understanding.

As shown in FIG. 2, the first lower arm switching element 11*ya* is a switching element through which a first drain current Id1 flows when the first lower arm switching element 11*ya* is in an ON state. The first drain current Id1 serves as a first applied current. The first drain current Id1 flows between the source and drain of the first lower arm switching element 11*ya*.

The first lower arm switching element 11*ya* includes a first gate terminal 21*a*. The first gate terminal 21*a* receives a gate voltage and serves as a first control terminal. The first lower arm switching element 11*ya* also includes a first drain terminal 22*a* and a first source terminal 23*a* through which the first drain current Id1 flows when the first lower arm switching element 11*ya* is in an ON state. The first source terminal 23*a* is also an applied terminal through which applied current flows.

In the present embodiment, the first drain terminal 22*a* of the first lower arm switching element 11*ya* is connected to source terminals of the upper arm switching elements 11*xa*, 11*xb*, and the first source terminal 23*a* is connected to the negative electrode busbar LN2. In the present embodiment, since the negative electrode busbar LN2 is connected to the reference potential V0, the reference potential V0 is applied to the first source terminal 23*a*.

The first lower arm switching element 11*ya* of the present embodiment includes a first parasitic inductance Ls1 through which the first drain current Id1 flows. The first parasitic inductance Ls1 includes, for example, a wiring pattern, a wire, and the first source terminal 23*a* in the switching element 11. Equivalently, the first parasitic inductance Ls1 is located on a current path through which the first drain current Id1 flows. More specifically, the first parasitic inductance Ls1 is located between the body of the first lower arm switching element 11*ya* and the first source terminal 23*a* and connected in series to the body of the first lower arm switching element 11*ya*.

The first lower arm switching element 11*ya* includes a first detection terminal 24*a* used to detect a first counter-electromotive force Vb1. The first counter-electromotive force Vb1 is produced by a first inductance component L1 that includes the first parasitic inductance Ls1.

The first inductance component L1 produces the first counter-electromotive force Vb1 when the first drain current Id1 changes. The first inductance component L1 may or may not include another inductance (e.g., parasitic inductance) included in the wiring (pattern) outside the first lower arm switching element 11*ya*. When the first drain current Id1 changes, it means that the first drain current Id1 starts to flow and that the first drain current Id1 stops.

The first detection terminal 24*a* is a terminal through which the first drain current Id1 does not easily flow. The first detection terminal 24*a* is connected to a feedback operational amplifier 101 via a feedback input terminal 33 that is located on the lower arm driver circuit 12*y*, which will be described in detail below. Thus, the first detection terminal 24*a* as viewed from the inside of the first lower arm switching element 11*ya* has a higher impedance than the first source terminal 23*a*. This hinders the flow of the first drain current Id1 into the first detection terminal 24*a*. Accordingly, the first detection terminal 24*a* is equivalently regarded as being connected between the body of the first lower arm switching element 11*ya* and the first parasitic inductance Ls1.

In such a configuration, when the first drain current Id1 changes, the first inductance component L1 including the first parasitic inductance Ls1 produces the first counter-electromotive force Vb1. Then, the first counter-electromotive force Vb1 is applied to the first detection terminal 24*a*. This allows the first counter-electromotive force Vb1 to be detected by detecting a voltage that is applied to the first detection terminal 24*a*.

The first counter-electromotive force Vb1, which is produced by the first inductance component L1, is positive when the first drain current Id1 increases and negative when the first drain current Id1 decreases. That is, the first counter-electromotive force Vb1 with a positive voltage is applied to the first detection terminal 24*a* when the first lower arm switching element 11*ya* is turned on, whereas the first counter-electromotive force Vb1 with a negative voltage is applied to the first detection terminal 24*a* when the first lower arm switching element 11*ya* is turned off.

The first detection terminal 24*a* may have any configuration. For example, when the first lower arm switching element 11*ya* includes multiple first source terminals 23*a*, one or more of the first source terminals 23*a* may be used as the first detection terminal 24*a*. Alternatively, for example, when the first lower arm switching element 11*ya* includes a gate drive terminal that is separate from the first source terminal 23*a*, the gate drive terminal may be used as the first detection terminal 24*a*. The gate drive terminal is also referred to as a Kelvin terminal or a Kelvin source terminal, and is a source terminal through which the first drain current Id1 does not flow. The gate drive terminal may have, for example, a smaller first parasitic inductance Ls1 than the first source terminal 23*a*.

The second lower arm switching element 11*yb* has the same configuration as the first lower arm switching element 11*ya*. That is, the second lower arm switching element 11*yb* is a switching element through which a second drain current Id2 flows when the second lower arm switching element 11*yb* is in an ON state. The second drain current Id2 serves as a second applied current. The second drain current Id2 flows between the source and drain of the second lower arm switching element 11*yb*.

The second lower arm switching element 11*yb* includes a second gate terminal 21*b* that serves as a second control terminal. The second lower arm switching element 11yb also includes a second drain terminal 22b and a second source terminal 23b through which the second drain current Id2 flows when the second lower arm switching element 11yb is in an ON state. The second lower arm switching element 11yb includes a second parasitic inductance Ls2 and a second detection terminal 24b that is used to detect a second counter-electromotive force Vb2. The second counter-electromotive force Vb2 is produced by a second inductance component L2 that includes the second parasitic inductance Ls2. The second counter-electromotive force Vb2 with a positive voltage is applied to the second detection terminal 24b when the second lower arm switching element 11yb is turned on, whereas the second counter-electromotive force Vb2 with a negative voltage is applied to the second detection terminal 24b when the second lower arm switching element 11yb is turned off. These configurations are the same as those of the corresponding first lower arm switching element 11ya, and thus will not be described in detail.

The lower arm driver circuit 12y will now be described. Also, how the two lower arm switching elements 11ya, 11yb are connected to the lower arm driver circuit 12y will be described.

Figure 3:
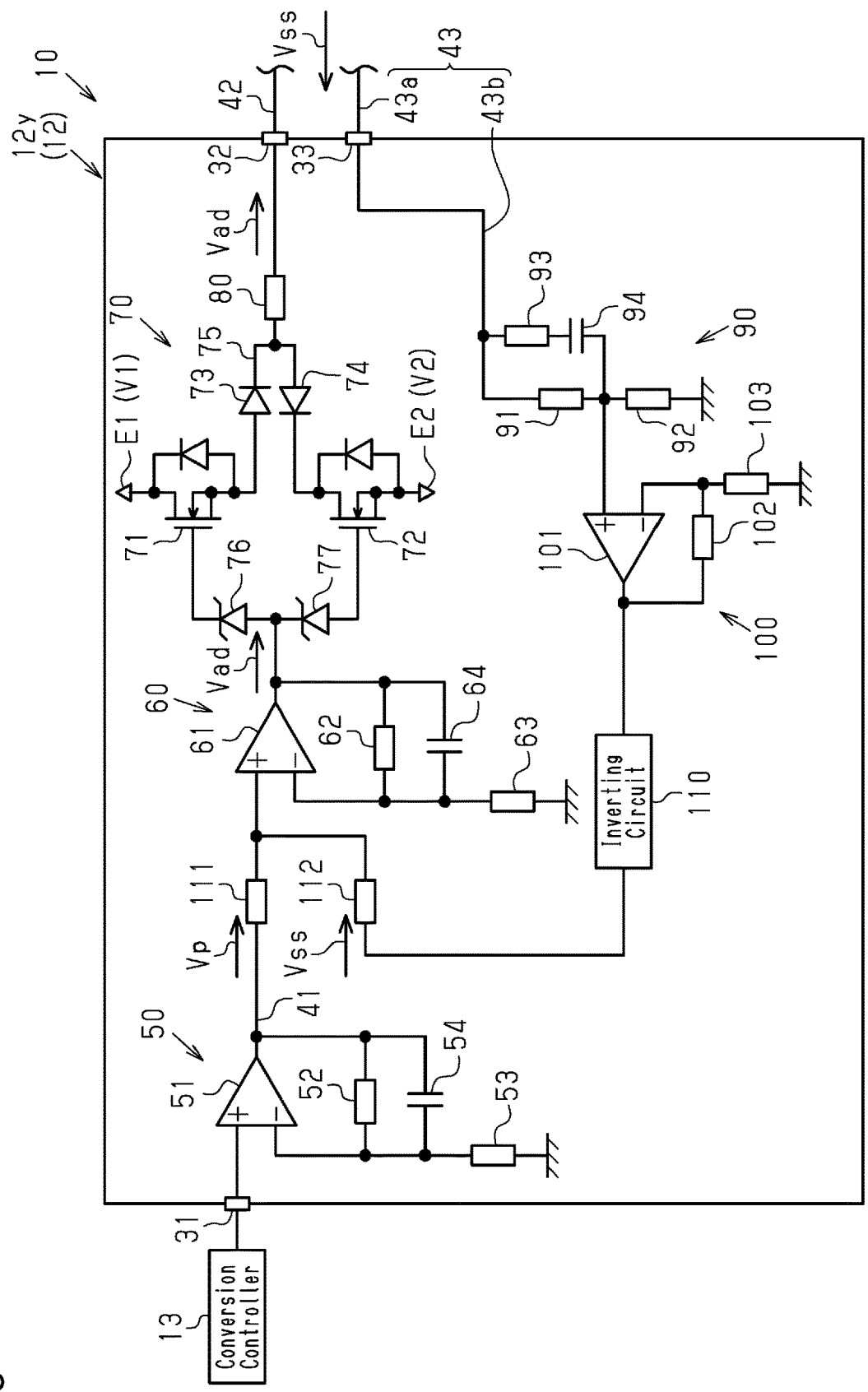
FIG. 3 is a circuit diagram showing the lower arm driver circuit.

As shown in FIGS. 2 and 3, the lower arm driver circuit 12y includes an external input terminal 31, an addition output terminal 32, a feedback input terminal 33, a filter circuit 50, an addition circuit 60, a current amplifier circuit 70, a voltage divider circuit 90, and a voltage amplifier circuit 100.

The power conversion device 10 includes an external input line 41 that connects the external input terminal 31 to the addition circuit 60, a control line 42 that connects the addition output terminal 32 to the two gate terminals 21a, 21b, and a common connection line 43 that connects the two detection terminals 24a, 24b to each other and connects the two detection terminals 24a, 24b to the addition circuit 60.

The external input terminal 31 is electrically connected to the conversion controller 13. The external input terminal 31 receives the external command voltage Vp from the conversion controller 13. The external command voltage Vp that has been input to the external input terminal 31 is input to the addition circuit 60 via the external input line 41.

The addition output terminal 32 is used to output a gate voltage (i.e., gate current) from the lower arm driver circuit 12y. An added voltage Vad that is output from the addition output terminal 32 is input to the two gate terminals 21a, 21b via the control line 42.

The feedback input terminal 33 of the present embodiment receives a combined electromotive force Vss of the two counter-electromotive forces Vb1, Vb2. More specifically, the common connection line 43 includes a first part line 43a that connects the two detection terminals 24a, 24b to each other and connects the two detection terminals 24a, 24b to the feedback input terminal 33. The first part line 43a of the present embodiment is, for example, a wiring pattern formed on a circuit board on which the two lower arm switching elements 11ya, 11yb and the lower arm driver circuit 12y are mounted. Instead, the first part line 43a may have any configuration. For example, the first part line 43a may be a wire.

The two detection terminals 24a, 24b are connected to each other by the first part line 43a. Thus, as shown by the long dashed double-short dashed line in FIG. 2, the first parasitic inductance Ls1 and the second parasitic inductance Ls2 are equivalently regarded as being connected in parallel to each other. This allows the feedback input terminal 33 to receive the combined electromotive force Vss of the first counter-electromotive force Vb1 and the second counter-electromotive force Vb2. More specifically, the combined electromotive force Vss is the average value of the two counter-electromotive forces Vb1, Vb2.

When the first detection terminal 24a and the second detection terminal 24b are short-circuited, the first counter-electromotive force Vb1 has the same voltage as the second counter-electromotive force Vb2, and the combined electromotive force Vss has the same voltage as the first counter-electromotive force Vb1 and the second counter-electromotive force Vb2 (Vss=Vb1=Vb2).

The filter circuit 50 is located on the external input line 41. The filter circuit 50 is used to reduce noise contained in the external command voltage Vp that has been received from the external input terminal 31. The filter circuit 50 is, for example, a low-pass filter circuit.

As shown in FIG. 3, the filter circuit 50 includes, for example, a filter operational amplifier 51, a first filter resistor 52, a second filter resistor 53, and a filter capacitor 54.

The external input line 41 connects the external input terminal 31 to the plus terminal (non-inverting input terminal) of the filter operational amplifier 51 and connects the output terminal of the filter operational amplifier 51 to the addition circuit 60.

The minus terminal (inverting input terminal) and the output terminal of the filter operational amplifier 51 are connected to each other via the first filter resistor 52. The filter capacitor 54 is connected in parallel to the first filter resistor 52. The second filter resistor 53 is connected in series to the first filter resistor 52 and the filter capacitor 54 and connected to the reference potential V0.

In this configuration, the external command voltage Vp is output from the filter circuit 50 (more specifically, the output terminal of the filter operational amplifier 51) and input to the addition circuit 60. The external command voltage Vp is amplified at an amplification ratio that corresponds to the ratio of resistance values of the two filter capacitors 52, 53, while reducing (i.e., eliminating) the noise of the external command voltage Vp with a cutoff frequency or higher by a RC circuit composed of the first filter resistor 52 and the filter capacitor 54. The filter circuit 50 may have any configuration.

As shown in FIG. 3, the addition circuit 60 is configured to receive the external command voltage Vp, which has been output from the filter circuit 50, and the combined electromotive force Vss.

More specifically, the common connection line 43 includes a second part line 43b that connects the feedback input terminal 33 to the addition circuit 60. The second part line 43b is located in the lower arm driver circuit 12y. The combined electromotive force Vss is transmitted via the second part line 43b. The combined electromotive force Vss that has been input to the feedback input terminal 33 is input to the addition circuit 60 via the second part line 43b.

The addition circuit 60 adds the external command voltage Vp to the combined electromotive force Vss and outputs the added voltage Vad to the two gate terminals 21a, 21b.

More specifically, the addition circuit 60 of the present embodiment includes, for example, an addition operational amplifier 61, a first addition resistor 62, a second addition resistor 63, and an addition capacitor 64.

The external input line 41 of the present embodiment includes a portion that connects the output terminal of the filter operational amplifier 51 to the plus terminal (non-inverting input terminal) of the addition operational amplifier 61. The second part line 43b of the present embodiment connects the feedback input terminal 33 to the external input line 41. That is, the addition circuit 60 includes a connection point of the external input line 41 and the second part line 43b. This allows the plus terminal of the addition operational amplifier 61 to receive a voltage in which the external command voltage Vp is combined with the combined electromotive force Vss.

The minus terminal (inverting input terminal) and the output terminal of the addition operational amplifier 61 are connected to each other via the first addition resistor 62. The addition capacitor 64 is connected in parallel to the first addition resistor 62. The second addition resistor 63 is connected in series to the first addition resistor 62 and the addition capacitor 64 and connected to the reference potential V0.

This configuration causes the added voltage Vad, which is obtained by adding the external command voltage Vp to the combined electromotive force Vss, to be output from the output terminal of the addition operational amplifier 61. The added voltage Vad is amplified at an amplification ratio that corresponds to the ratio of resistance values of the two addition resistors 62, 63, while reducing (i.e., eliminating) the noise of the added voltage Vad with a cutoff frequency or higher by an RC circuit composed of the first addition resistor 62 and the addition capacitor 64. The addition circuit 60 may have any configuration.

The current amplifier circuit 70 is used to supply current necessary to drive the switching elements 11 while maintaining the waveform of the added voltage Vad.

As shown in FIG. 3, the current amplifier circuit 70 of the present embodiment includes, for example, a first amplifier switching element 71 and a second amplifier switching element 72. The first amplifier switching element 71 and the second amplifier switching element 72 are, for example, n-type MOSFETs.

The drain of the first amplifier switching element 71 is connected to a first supply source E1 that applies a first supply voltage V1. The source of the second amplifier switching element 72 is connected to a second supply source E2 that applies a second supply voltage V2. The first supply voltage V1 is, for example, positive. The second supply voltage V2 is, for example, negative. The source of the first amplifier switching element 71 and the drain of the second amplifier switching element 72 are connected to each other by a connection line 75. Two diodes 73, 74 connected in reverse are disposed on the connection line 75.

The gates of the two amplifier switching elements 71, 72 are connected to the addition circuit 60 (more specifically, the output terminal of the addition operational amplifier 61). A first Zener diode 76 is disposed between the gate of the first amplifier switching element 71 and the addition circuit 60. The anode of the first Zener diode 76 is connected to the addition circuit 60. The cathode of the first Zener diode 76 is connected to the gate of the first amplifier switching element 71.

A second Zener diode 77 is disposed between the gate of the second amplifier switching element 72 and the addition circuit 60. The cathode of the second Zener diode 77 is connected to the addition circuit 60. The anode of the second Zener diode 77 is connected to the gate of the second amplifier switching element 72. The added voltage Vad that has been output from the addition circuit 60 is input to the gate of the second amplifier switching element 72 via the second Zener diode 77.

In this configuration, the added voltage Vad is output from the connection line 75, which connects the two diodes 73, 74 to each other. Further, a gate current that is necessary to drive the switching elements 11 is supplied from the two supply sources E1, E2.

The output (more specifically, the connection line 75) of the current amplifier circuit 70 is connected to the addition output terminal 32. Thus, the added voltage Vad is output from the addition output terminal 32 and input to the two gate terminals 21a, 21b via the control line 42. That is, the added voltage Vad serves as the gate voltage in the present embodiment. The current amplifier circuit 70 may have any configuration.

As shown in FIG. 3, the lower arm driver circuit 12y includes a gate resistor 80 on a line that connects the current amplifier circuit 70 to the addition output terminal 32. The gate resistor 80 regulates the gate current.

As shown in FIGS. 2 and 3, the power conversion device 10 of the present embodiment includes the voltage divider circuit 90 and the voltage amplifier circuit 100 on the common connection line 43. In the present embodiment, the voltage divider circuit 90 and the voltage amplifier circuit 100 are located on the second part line 43b.

Referring to FIG. 3, the voltage divider circuit 90 divides the combined electromotive force Vss. More specifically, the voltage divider circuit 90 includes, for example, voltage divider resistors 91, 92 that divide the combined electromotive force Vss and a resistor 93 and a capacitor 94 that are connected in parallel to the first voltage divider resistor 91. The resistor 93 and the capacitor 94 are included in a filter circuit that reduces noise contained in the combined electromotive force Vss.

The voltage amplifier circuit 100 includes the feedback operational amplifier 101, a first amplifier resistor 102, and a second amplifier resistor 103.

The feedback operational amplifier 101 is located on the second part line 43b. The second part line 43b connects the plus terminal of the feedback operational amplifier 101 to the voltage divider circuit 90. The plus terminal of the feedback operational amplifier 101 receives the combined electromotive force Vss that has been divided by the voltage divider circuit 90.

The output terminal of the feedback operational amplifier 101 is connected to the addition circuit 60 (more specifically, external input line 41) by the second part line 43b. The combined electromotive force Vss that has been output from the feedback operational amplifier 101 is input to the addition circuit 60 via the second part line 43b.

Further, the output terminal of the feedback operational amplifier 101 is connected to the minus terminal (inverting input terminal) of the feedback operational amplifier 101 via the first amplifier resistor 102. In addition, the second amplifier resistor 103 is connected to a connection line that connects the first amplifier resistor 102 to the minus terminal of the feedback operational amplifier 101, and is connected to the reference potential V0. That is, the voltage amplifier circuit 100 of the present embodiment is a non-inverting amplifier circuit.

In this configuration, the combined electromotive force Vss that has been input to the feedback input terminal 33 is divided by the voltage divider circuit 90 and amplified by the voltage amplifier circuit 100. The amplification ratio of the voltage amplifier circuit 100 may be equal to, greater than, or less than 1.

In the present embodiment, impedance conversion is performed by the voltage amplifier circuit 100. More specifically, the input side of the feedback operational amplifier 101 has a higher impedance than the output side of the feedback operational amplifier 101. This restricts the flow of part of the first drain current Id1 into the two detection terminals 24*a*, 24*b*, feedback input terminal 33, and common connection line 43.

The power conversion device 10 includes an inverting circuit 110 that inverts the combined electromotive force Vss. The inverting circuit 110 is located, for example, in the lower arm driver circuit 12*y* (more specifically, on the second part line 43*b*).

The inverting circuit 110 inverts the polarity of the combined electromotive force Vss. More specifically, the inverting circuit 110 converts the combined electromotive force Vss into a negative voltage (minus) when the force has a positive voltage (plus), and converts the combined electromotive force Vss into a positive voltage when the force has a negative voltage. In the present embodiment, the absolute value of the combined electromotive force Vss is not changed by the inverting circuit 110. The inverting circuit 110 may have any configuration.

The lower arm driver circuit 12*y* includes an external input resistor 111 on the external input line 4 and a feedback input resistor 112 on the common connection line 43. The external input resistor 111 is located on a portion of the external input line 41 that connects the filter circuit 50 to the addition circuit 60. The feedback input resistor 112 is located on a portion of the second part line 43*b* of the common connection line 43 that connects the voltage amplifier circuit 100 to the addition circuit 60.

Figure 4:
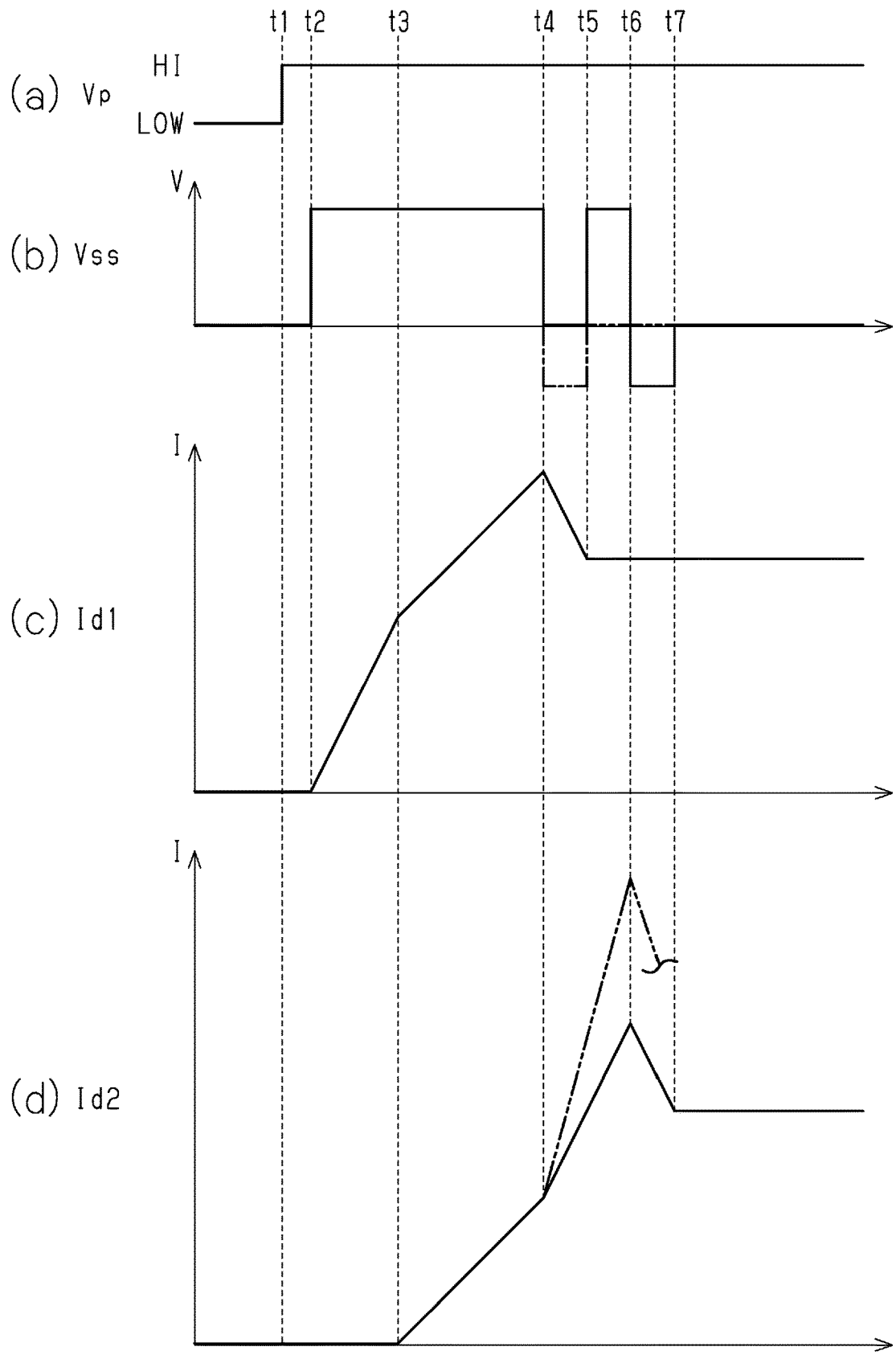
FIG. 4 includes sections (a) to (d), in which section (a) shows the waveform of the external command voltage when the lower arm switching elements are turned on, section (b) is a graph schematically showing changes in the combined electromotive force, section (c) is a graph schematically showing changes in the first drain current, and section (d) is a graph schematically showing changes in the second drain current.

The operation of the present embodiment will now be described with reference to FIG. 4, using an example in which the lower arm switching elements 11*ya*, 11*yb* are turned on. Section (a) of FIG. 4 is a timing diagram showing a change in the external command voltage Vp. Section (b) of FIG. 4 shows a waveform schematically showing the combined electromotive force Vss. Section (c) of FIG. 4 is a graph showing the waveform of the first drain current Id1. Section (d) of FIG. 4 is a graph showing the waveform of the second drain current Id2. In the present embodiment, the first drain current Id1 and the second drain current Id2 each reach a peak at a different point in time.

As shown in section (a) of FIG. 4, the external command voltage Vp rises at the point in time t1. This allows the two lower arm switching elements 11*ya*, 11*yb* to simultaneously receive the rising of the external command voltage Vp.

The two lower arm switching elements 11*ya*, 11*yb* may each vary in characteristics. Thus, even if the two lower arm switching elements 11*ya*, 11*yb* simultaneously receive the rising of the external command voltage Vp, the two drain currents Id1, Id2 may each rise at a different point in time.

For example, it is assumed that the first drain current Id1 starts to flow at the point in time t2 earlier than the second drain current Id2 as shown in sections (c) and (d) of FIG. 4. In this case, the first counter-electromotive force Vb1 is produced when the first drain current Id1 starts to flow. Thus, as shown in section (b) of FIG. 4, the combined electromotive force Vss is produced so that the combined electromotive force Vss is fed back to the addition circuit 60.

The first counter-electromotive force Vb1 produced when the first counter-electromotive force Vb1 starts to flow has a positive voltage. After the combined electromotive force Vss is divided by the voltage divider circuit 90 and amplified by the voltage amplifier circuit 100, the polarity of the combined electromotive force Vss is inverted. Then, the combined electromotive force Vss is input to the addition circuit 60. Thus, the combined electromotive force Vss with a negative voltage is input to the addition circuit 60. This reduces the inclination of the first drain current Id1 and allows the first drain current Id1 to rise gently. In this situation, the combined electromotive force Vss is approximately the half of the first counter-electromotive force Vb1.

Subsequently, it is assumed that the second drain current Id2 starts to flow at the point in time t3 as shown in section (d) of FIG. 4. The second counter-electromotive force Vb2 is produced when the second drain current Id2 starts to flow. When the combined electromotive force Vss of the first counter-electromotive force Vb1 and the second counter-electromotive force Vb2 is fed back, the two drain currents Id1, Id2 rise gently. In detail, the inclinations of the two drain currents Id1, Id2 are smaller than those when only the first drain current Id1 flows. In more detail, the inclinations of the two drain currents Id1, Id2 are approximately the half of the inclination of the first drain current Id1 in the period from t2 to t3.

As shown in section (c) of FIG. 4, the first drain current Id1 reaches a peak at the point in time t4 and then starts to drop. Thus, the first counter-electromotive force Vb1 is produced in an orientation opposite that in the period from t2 to t4.

In contrast, at the point in time t4, the second drain current Id2 is rising and thus the second counter-electromotive force Vb2 is being produced. Thus, as shown in section (b) of FIG. 4, the combined electromotive forces Vss cancel each other out, and thus are 0 or have a value close to 0.

Subsequently, as shown in section (c) of FIG. 4, the first drain current Id1 reaches a saturation current at the point in time t5 and is then kept at that saturation current. The saturation current also refers to current that flows in a steady manner when the first lower arm switching element 11*ya* is in an ON state.

When the first drain current Id1 becomes a saturation current, the first counter-electromotive force Vb1 becomes 0. Thus, as shown in section (b) of FIG. 4, the combined electromotive force Vss corresponding to the second counter-electromotive force Vb2 is fed back. This allows the surge reduction effect through the feedback of the combined electromotive force Vss to continue and limits excessive rising of the second drain current Id2 as shown by the long dashed double-short dashed line in section (d) of FIG. 4.

The actual period from t4 to t5 is extremely short. Thus, the combined electromotive force Vss, which is 0, produces a negligible impact.

As shown in section (d) of FIG. 4, the second drain current Id2 reaches a peak at the point in time t6 and then starts to drop. Thus, the second counter-electromotive force Vb2 is produced in an orientation opposite that in the period from t3 to t6. Accordingly, as shown in section (b) of FIG. 4, the combined electromotive force Vss acting in the opposite orientation is produced. Subsequently, at the point in time t7, the second drain current Id2 becomes a saturation current and the combined electromotive force Vss becomes 0.

As described above, in the present embodiment, even when the two lower arm switching elements 11*ya*, 11*yb* each rise at a different point in time (more specifically, the drain currents Id1, Id2 each start to flow at a different point in time) due to element variations or the like, feedback using the combined electromotive force Vss is performed over a period until the two drain currents Id1, Id2 reach a peak.

The same applies to when the lower arm switching elements 11*ya*, 11*yb* are turned off. That is, when the lower arm switching elements 11*ya*, 11*yb* are turned off, the drain currents Id1, Id2 start to drop and thus the counter-electromotive forces Vb1, Vb2 with negative voltages are produced at the inductance components L1, L2. After the combined electromotive force Vss of the two counter-electromotive forces Vb1, Vb2 is divided by the voltage divider circuit 90 and amplified by the voltage amplifier circuit 100, the polarity of the combined electromotive force Vss is inverted. Further, the combined electromotive force Vss is input to the addition circuit 60. In this case, even when the drain currents Id1, Id2 each drop in a different manner, feedback using the combined electromotive forces Vss is performed until the two drain currents Id1, Id2 reach 0.

The operation gained when the upper arm switching elements 11xa, 11xb are turned on and off is the same as that gained when the lower arm switching elements 11ya, 11yb are turned on and off. Thus, how the upper arm switching elements 11xa, 11xb work will not be described in detail.

As described above in detail, the present embodiment provides the following advantages. To facilitate understanding, the first switching elements 11uua, 11uda, 11vua, 11vda, 11wua, 11wda are simply referred to as the first switching element 11a, and the second switching elements 11uub, 11udb, 11vub, 11vdb, 11wub, 11wdb are simply referred to as the second switching element 11b.

(1) The power conversion device 10 includes the first switching element 11a, through which the first drain current Id1 (first applied current) flows when the first switching element 11a is in an ON state, and the second switching element 11b, through which the second drain current Id2 (second applied current) flows when the second switching element 11b is in an ON state. The second switching element 11b is connected in parallel to the first switching element 11a. The power conversion device 10 includes the driver circuits 12, each driving the two switching elements 11a, 11b.

The switching elements 11a, 11b respectively include the gate terminals 21a, 21b (control terminals) and the detection terminals 24a, 24b. The detection terminals 24a, 24b are used to detect the counter-electromotive forces Vb1, Vb2, which are respectively produced by the inductance components L1, L2 including the parasitic inductance Ls1, Ls2. The driver circuits 12 each include the external input terminal 31, which receives the external command voltage Vp, the addition circuit 60, which outputs the added voltage Vad, and the addition output terminal 32, which outputs the added voltage.

In this configuration, the power conversion device 10 includes the control line 42, which connects the addition output terminal 32 to the two gate terminals 21a, 21b, and the common connection line 43, which connects the two detection terminals 24a, 24b to each other and connects the two detection terminals 24a, 24b to the addition circuit 60. Further, the combined electromotive force Vss of the two counter-electromotive forces Vb1, Vb2 is transmitted via the common connection line 43. The addition circuit 60 receives the combined electromotive force Vss and the external command voltage Vp, and outputs the added voltage Vad by adding the combined electromotive force Vss to the external command voltage Vp.

In this configuration, the two switching elements 11a, 11b connected in parallel to each other are operated based on the added voltage Vad. This allows the two switching elements 11a, 11b to be operated in synchronization. Thus, current in which the two drain currents Id1, Id2 are combined is supplied. Accordingly, as compared with when one switching element is used, a larger current is supplied. Further, in this configuration, the two switching elements 11a, 11b are operated based on the added voltage Vad in which the combined electromotive force Vss is fed back. This reduces both the power loss and surge.

Particularly, in this configuration, the common connection line 43 connects the two detection terminals 24a, 24b to each other and connects the two detection terminals 24a, 24b to the addition circuit 60. This allows the combined electromotive force Vss of the two counter-electromotive forces Vb1, Vb2 to be used as a voltage that is fed back to the addition circuit 60. Accordingly, even when variations occur in the operation of the two switching elements 11a, 11b, feedback is given to the two switching elements 11a, 11b. This reduces both the power loss and surge.

More specifically, when, for example, counter-electromotive forces are fed back on the condition that the two switching elements 11a, 11b connected in parallel to each other are controlled using the same added voltage Vad, the counter-electromotive force produced in one of the two switching elements 11a, 11b is simply needs to be fed back in a normal case. Thus, the voltage that is fed back to the addition circuit 60 may normally be one of the two counter-electromotive forces Vb1, Vb2, instead of the combined electromotive force Vss.

Element variations may occur in the two switching elements 11a, 11b. Thus, although the same added voltage Vad is input to the two gate terminals 21a, 21b, variations may occur in the operation of the two switching elements 11a, 11b.

If the counter-electromotive force produced in one of the two switching elements 11a, 11b when such variations occur is fed back, the effect gained through the feedback may not be gained in one of the two switching elements 11a, 11b. The inventors of the present invention discovered this inconvenience.

For example, it is assumed that the first counter-electromotive force Vb1 is employed as the voltage that is fed back to the addition circuit 60. In this case, as shown by the long dashed double-short dashed line in section (b) of FIG. 4, the voltage that is fed back is directed in the opposite direction at the point in time t4 and then becomes 0 at the point in time t5. As a result, no feedback using counter-electromotive force is given. Thus, as shown by the long dashed double-short dashed line in section (d) of FIG. 4, the second drain current Id2 rises excessively. In this case, the second switching element 11b may be operated in a problematic manner.

In the present configuration, the voltage that is fed back to the addition circuit 60 is the combined electromotive force Vss. Thus, as described above, even when variations occur in the operation of the two switching elements 11a, 11b, feedback with the counter-electromotive force is given to the two switching elements 11a, 11b. This eliminates the above-described inconvenience. Accordingly, the power loss and surge are both reduced by the configuration in which the two switching elements 11a, 11b are connected in parallel to each other.

(2) The driver circuit 12 includes the feedback input terminal 33, which receives the combined electromotive force Vss. The common connection line 43 includes the first part line 43a and the second part line 43b. The first part line 43a connects the two detection terminals 24a, 24b to each other and connects the two detection terminals 24a, 24b to the feedback input terminal 33. The second part line 43b is located in the driver circuit 12 and connects the feedback input terminal 33 to the addition circuit 60.

In this configuration, the two counter-electromotive forces Vb1, Vb2 are combined by the first part line 43a into the combined electromotive force Vss, which is input to the feedback input terminal 33. Then, the combined electromotive force Vss is input to the addition circuit 60 via the second part line 43b. This provides the above-described advantage. Additionally, this configuration eliminates the need for the driver circuit 12 to have two feedback input terminals that respectively correspond to the two counter-electromotive forces Vb1, Vb2. As a result, the driver circuit 12 has a simple configuration.

(3) The power conversion device 10 includes the voltage amplifier circuit 100, which amplifies the combined electromotive force Vss and is located on the second part line 43b.

In this configuration, the combined electromotive force Vss is amplified by the voltage amplifier circuit 100 and then input to the addition circuit 60. Thus, even when the two inductance components L1, L2 produce small voltages, the combined electromotive force Vss with a desired magnitude is input to the addition circuit 60.

(4) In the power conversion device 10, the first switching elements 11a and the second switching elements 11b include the first upper arm switching element 11xa and the second upper arm switching element 11xb, and the first lower arm switching element 11ya and the second lower arm switching element 11yb. The parallel connector of the two w-phase upper arm switching elements 11xa, 11xb and the parallel connector of the two w-phase lower arm switching elements 11ya, 11yb are connected in series to each other.

The power conversion device 10 includes the positive electrode busbar LN1, to which the two upper arm switching elements 11xa, 11xb are connected, and the negative electrode busbar LN2, to which the two lower arm switching elements 11ya, 11yb are connected. The negative electrode busbar LN2 is connected to the reference potential V0. In the power conversion device 10, the driver circuit 12 includes the upper arm driver circuit 12x and the lower arm driver circuit 12y, which respectively drive the two upper arm switching elements 11xa, 11xb and the two lower arm switching elements 11ya, 11yb. The common connection line 43 connects the two detection terminals 24a, 24b of the two lower arm switching elements 11ya, 11yb to each other and connects the two detection terminals 24a, 24b to the lower arm driver circuit 12y.

The counter-electromotive forces Vb1, Vb2, which are respectively applied to the detection terminals 24a, 24b of the lower arm switching elements 11ya, 11yb, have a positive voltage when the lower arm switching elements 11ya, 11yb are turned on and have a negative voltage when the lower arm switching elements 11ya, 11yb are turned off. More specifically, the detection terminals 24a, 24b of the lower arm switching elements 11ya, 11yb are connected between the bodies of the lower arm switching elements 11ya, 11yb and the parasitic inductance Ls1, Ls2.

The power conversion device 10 includes the inverting circuit 110, which inverts the combined electromotive force Vss and is located on the common connection line 43. The combined electromotive force Vss inverted by the inverting circuit 110 is input to the addition circuit 60.

In this configuration, on the condition that the negative electrode busbar LN2 is connected to the reference potential V0 and on the condition that the counter-electromotive forces Vb1, Vb2 with positive voltages are applied when the lower arm switching elements 11ya, 11yb are turned on and the counter-electromotive forces Vb1, Vb2 with negative voltages are applied when the lower arm switching elements 11ya, 11yb are turned off, feedback using the counter-electromotive forces Vb1, Vb2 is given to the two lower arm switching elements 11ya, 11yb.

Second Embodiment

The present embodiment is different from the first embodiment in the configuration of the switching elements 11 of the power conversion device 10 and in how the power conversion device 10 is connected to the feedback input terminal 33 of the driver circuit 12. The difference from the first embodiment will now be described with reference to FIG. 5.

Figure 5:
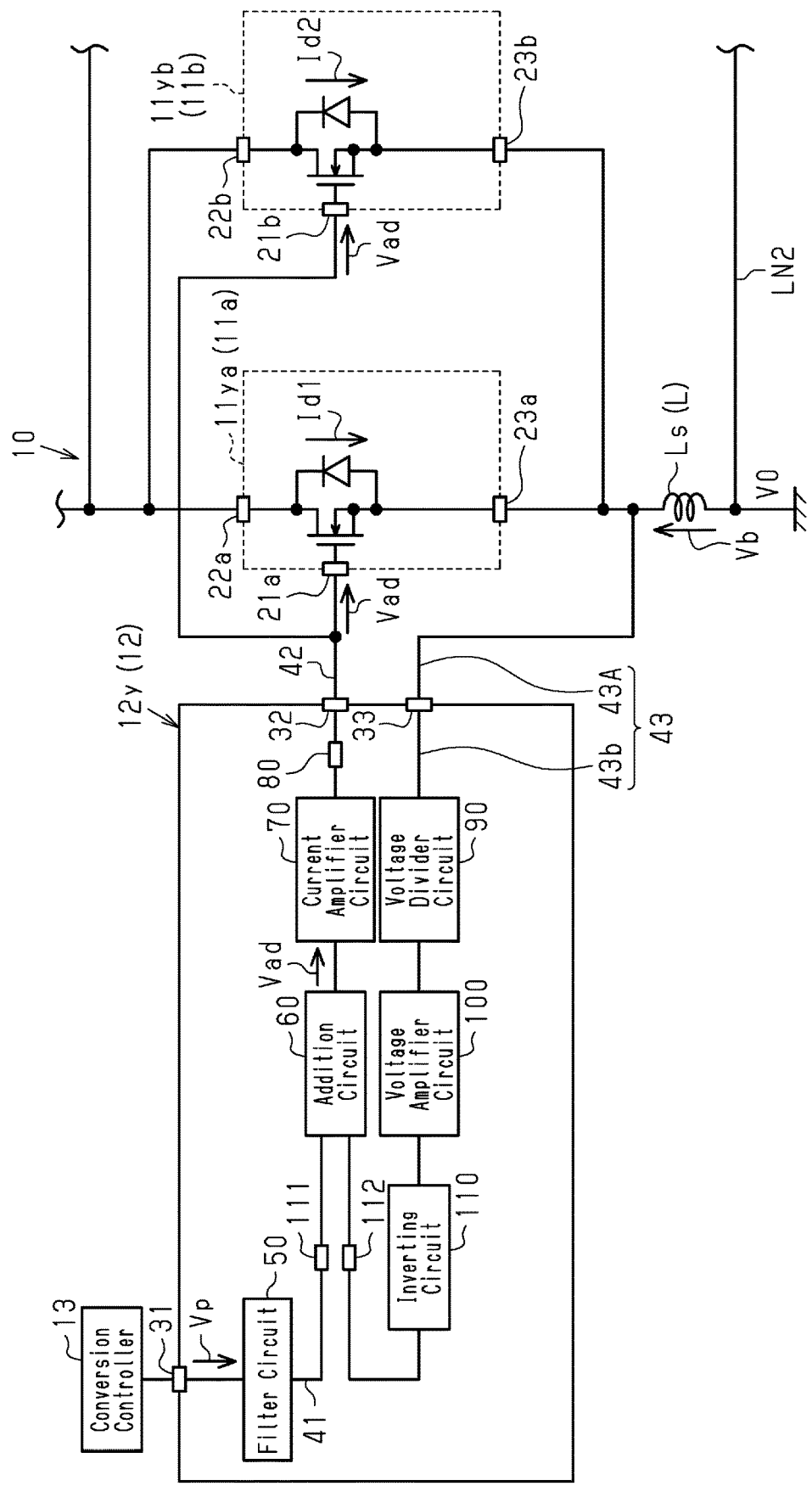
FIG. 5 is a block circuit diagram showing the electric configuration of the lower arm driver circuit and the two lower arm switching elements in the power conversion device according to a second embodiment.

As shown in FIG. 5, the switching elements 11 of the power conversion device 10 of the present embodiment have the same configuration as the switching elements 11 of the first embodiment, except that the switching elements 11 of the present embodiment do not include detection terminals.

The first source terminal 23a of the first lower arm switching element 11ya and the second source terminal 23b of the second lower arm switching element 11yb function as output terminals.

In the following description, the first source terminal 23a of the first lower arm switching element 11ya is referred to as the first output terminal, and the second source terminal 23b of the second lower arm switching element 11yb is referred to as the second output terminal.

The power conversion device 10 includes a detection line 43A. The detection line 43A includes an inductance L and connects the first output terminal of the first lower arm switching element 11ya to the second output terminal of the second lower arm switching element 11yb.

The inductance L produces the counter-electromotive force Vb when a change occurs in the combined current of the first drain current Id1 and the second drain current Id2. The inductance L may be formed using a coil or may be a parasitic inductance Ls.

The detection line 43A connects the two output terminals (first output terminal and second output terminal) to the addition circuit 60 such that the counter-electromotive force Vb produced by the inductance L is input to the addition circuit 60.

The detection line 43A of the present embodiment is connected to the feedback input terminal 33 of the driver circuit 12, and is a wiring pattern on a circuit board. Further, the detection line 43A is connected to the reference potential V0 in the same manner as the negative electrode busbar LN2.

As described above in detail, the present embodiment provides the following advantages in addition to the advantages of the first embodiment.

(5) The power conversion device 10 includes the detection line 43A, which includes the inductance L and connects the first output terminal of the first lower arm switching element 11ya to the second output terminal of the second lower arm switching element 11yb. Further, the detection line 43A connects the two output terminals (first output terminal and second output terminal) to the addition circuit 60 such that the counter-electromotive force Vb produced by the inductance L is input to the addition circuit 60.

In this configuration, in the same manner as the first embodiment, even when variations occur in the operation of the two switching elements 11a, 11b, feedback is given to the two switching elements 11a, 11b. This reduces both the power loss and surge. Further, the switching elements 11 do not need to include detection terminals.

(6) The power conversion device 10 includes the voltage amplifier circuit 100, which amplifies the counter-electromotive force Vb.

In this configuration, the counter-electromotive force Vb is amplified by the voltage amplifier circuit 100 and then input to the addition circuit 60. Thus, even when the inductance component L produces a small voltage, the counter-electromotive force Vb with a desired magnitude is input to the addition circuit 60.

Modifications

The above-described embodiments may be modified as follows. The above-described embodiments and the following modifications may be combined as long as the combined modifications remain technically consistent with each other.

Figure 6:
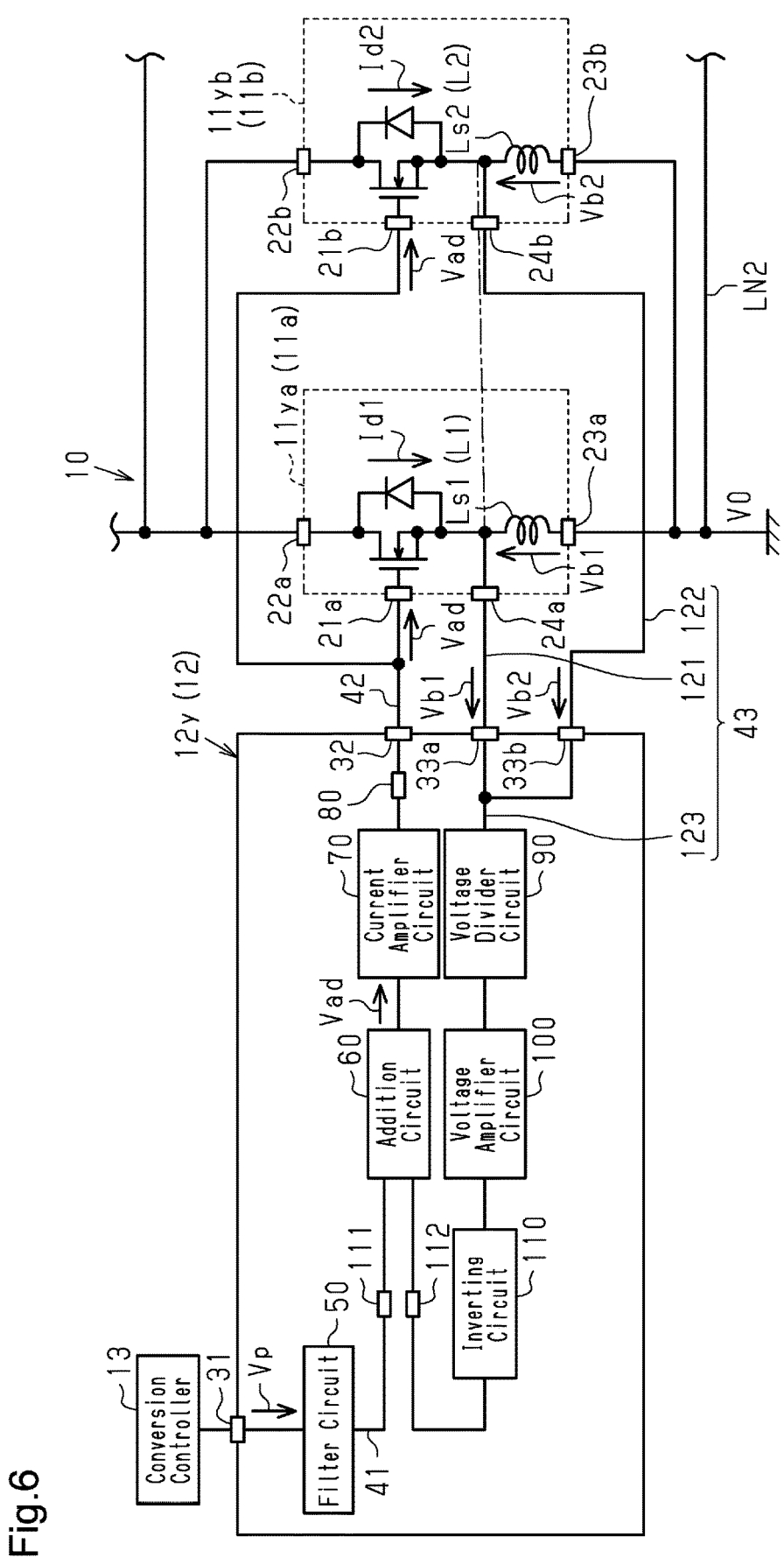
FIG. 6 is a block circuit diagram showing the common connection line according to a modification.

As shown in FIG. 6, the lower arm driver circuit 12y may include a first feedback input terminal 33a that receives the first counter-electromotive force Vb1 and a second feedback input terminal 33b that receives the second counter-electromotive force Vb2. In this case, the common connection line 43 may include a first line 121 that connects the first detection terminal 24a to the first feedback input terminal 33a and a second line 122 that connects the second detection terminal 24b to the second feedback input terminal 33b. The common connection line 43 preferably includes a third line 123 located in the lower arm driver circuit 12y. The third line 123 connects the two feedback input terminals 33a, 33b to each other and connects the two feedback input terminals 33a, 33b to the addition circuit 60. This configuration provides advantage (1) and the like.

The inverting circuit 110 may be located at any position. For example, the inverting circuit 110 may be located on a portion of the second part line 43b that connects the feedback input terminal 33 to the voltage divider circuit 90, or may be located on the first part line 43a. Alternatively, the inverting circuit 110 may be located on a stage prior to the voltage amplifier circuit 100 (located on the input side of the voltage amplifier circuit 100), or may be located on a stage subsequent to the voltage amplifier circuit 100 (located on the output side of the voltage amplifier circuit 100).

In the above-described embodiments, two switching elements 11a, 11b are connected in parallel to each other. Instead, three or more switching elements may be connected in parallel to each other. Even in this case, the power conversion device 10 includes the first switching element 11a and the second switching element 11b.

The switching elements 11 are not limited to MOSFETs and may be, for example, IGBTs. In this case, the gate terminal of each switching element 11 corresponds to the control terminal, and the collector current flowing between the collector and emitter of the switching element 11 corresponds to the applied current. The emitter also refers to the applied terminal to which the applied current flows.

The current amplifier circuit 70 may be omitted.

The filter circuit 50 may be omitted.

The voltage divider circuit 90 may be omitted. That is, the combined electromotive force Vss that is input to the addition circuit 60 may be a divided voltage or may be a non-divided voltage.

The voltage amplifier circuit 100 may be an inverting amplifier circuit. In this case, the voltage amplifier circuit 100 corresponds to the inverting circuit. Thus, the inverting circuit 110 may be omitted. That is, the inverting circuit may be separate from the voltage amplifier circuit or may be an inverting amplifier circuit that has an amplifying function.

The voltage amplifier circuit 100 may be omitted. That is, the combined electromotive force Vss that is input to the addition circuit 60 may be an amplified force or may be a non-amplified force.

Each switching element 11 is included in an inverter. Instead, each switching element 11 may be included in, for example, a DC/DC converter that converts direct-current power of the power storage device 203 into direct-current power with a different voltage. That is, the power conversion device 10 is not limited to an inverter and may be any device, such as a DC/DC converter, an AC/AC converter, or an AC/DC inverter. In other words, the power conversion device 10 may convert direct-current power or alternating-current power into direct-current power or alternating-current power.

The load is not limited to the electric motor 201.

The power conversion device 10 does not have to be mounted in the vehicle 200. That is, the power conversion device 10 may drive a load other than that disposed in the vehicle 200.

An example that can be obtained from the above-described embodiments and modifications will now be described.

(A) The power conversion device preferably includes the voltage amplifier circuit on the common connection line. The inverting circuit is preferably located on a stage prior to or subsequent to the voltage amplifier circuit on the common connection line.

(B) The inverting circuit is preferably an inverting amplifier circuit.

REFERENCE SIGNS LIST

10) Power Conversion Device; 11) Switching Element; 11a) First Switching Element; 11b) Second Switching Element; 11xa) First Upper Arm Switching Element; 11xb) Second Upper Arm Switching Element; 11ya) First Lower Arm Switching Element; 11yb) Second Lower Arm Switching Element; 12) Driver Circuit; 12x) Upper Arm Driver Circuit; 12y) Lower Arm Driver Circuit; 21a) First Gate Plus Terminal (First Control Terminal); 21b) Second Gate Plus Terminal (Second Control Terminal); 24a) First Detection Terminal; 24b) Second Detection Terminal; 31) External Input Terminal; 32) Addition Output Terminal; 33, 33a, 33b) Feedback Input Terminal; 42) Control Line; 43) Common Connection Line; 43a) First Part Line; 43b) Second Part Line; 43A) Detection Line; 60) Addition Circuit; 70) Current Amplifier Circuit; 90) Voltage Amplifier Circuit; 100) Voltage Amplifier Circuit; 110) Inverting Circuit; 200) Vehicle; 32a) Electric Motor (Load); 203) Power Storage Device; Vp) External Command Voltage; Vb1) First Counter-Electromotive Force; Vb2) Second Counter-Electromotive Force; Vss) Combined Electromotive Force; Vad) Added Voltage; V0) Reference Potential; Ls1) First Parasitic Inductance; Ls2) Second Parasitic Inductance; Ls) Parasitic Inductance; L1) First Inductance Component; L2) Second Inductance Component; L) Inductance; Id1) First Drain Current; Id2) Second Drain Current; LN1) Positive Electrode Busbar; LN2) Negative Electrode Busbar

The invention claimed is:

1. A power conversion device, comprising:
a first switching element through which a first applied current flows when the first switching element is in an ON state;
a second switching element through which a second applied current flows when the second switching element is in an ON state, the second switching element being connected in parallel to the first switching element; and
a driver circuit that is configured to drive the two switching elements, wherein
the first switching element includes:
  a first control terminal;
  a first parasitic inductance through which the first applied current flows; and a first detection terminal used to detect a first counter-electromotive force, the first counter-electromotive force being produced by a first inductance component that includes the first parasitic inductance, the second switching element includes:
  a second control terminal;
  a second parasitic inductance through which the second applied current flows; and
  a second detection terminal used to detect a second counter-electromotive force, the second counter-electromotive force being produced by a second inductance component that includes the second parasitic inductance, the driver circuit includes:
  an external input terminal that is configured to receive an external command voltage;
  an addition circuit that is configured to output an added voltage; and
  an addition output terminal to which the added voltage is output, the power conversion device further comprises:
  a control line that connects the addition output terminal to the two control terminals; and
  a common connection line that connects the two detection terminals to each other and connects the two detection terminals to the addition circuit, wherein a combined electromotive force of the two counter-electromotive forces is transmitted via the common connection line, and the addition circuit is configured to receive the combined electromotive force and the external command voltage, and output the added voltage by adding the combined electromotive force to the external command voltage.

2. The power conversion device according to claim 1, wherein
the driver circuit includes a feedback input terminal that is configured to receive the combined electromotive force, and
the common connection line includes:
  a first part line that connects the two detection terminals to each other and connects the two detection terminals to the feedback input terminal; and
  a second part line that connects the feedback input terminal to the addition circuit, the second part line being located in the driver circuit.

3. The power conversion device according to claim 2, further comprising a voltage amplifier circuit that is configured to amplify the combined electromotive force, the voltage amplifier circuit being located on the second part line.

4. The power conversion device according to claim 1, wherein
the first switching element and the second switching element include:
  a first upper arm switching element and a second upper arm switching element connected in parallel to each other; and
  a first lower arm switching element and a second lower arm switching element connected in parallel to each other,
a parallel connector of the first upper arm switching element and the second upper arm switching element is connected in series to a parallel connector of the first lower arm switching element and the second lower arm switching element,
the power conversion device further comprises:
  a positive electrode busbar to which the two upper arm switching elements are connected; and
  a negative electrode busbar to which the two lower arm switching elements are connected, the negative electrode busbar being connected to a reference potential,
the driver circuit includes:
  an upper arm driver circuit that is configured to drive the two upper arm switching elements; and
  a lower arm driver circuit that is configured to drive the two lower arm switching elements,
the first counter-electromotive force with a negative voltage is applied to the first detection terminal of the first lower arm switching element and the second counter-electromotive force with a negative voltage is applied to the second detection terminal of the second lower arm switching element when the first lower arm switching element and the second lower arm switching element are turned off,
the common connection line connects the two detection terminals of the two lower arm switching elements to each other and connects the two detection terminals to the addition circuit of the lower arm driver circuit, and
the power conversion device further comprises an inverting circuit that is configured to invert the combined electromotive force, the inverting circuit being located on the common connection line, and
the addition circuit is configured to receive the combined electromotive force that has been inverted by the inverting circuit.

5. A power conversion device, comprising:
a first switching element through which a first applied current flows when the first switching element is in an ON state;
a second switching element through which a second applied current flows when the second switching element is in an ON state, the second switching element being connected in parallel to the first switching element; and
a driver circuit that is configured to drive the two switching elements, wherein
the first switching element includes:
  a first control terminal; and
  a first output terminal,
the second switching element includes:
  a second control terminal; and
  a second output terminal,
the driver circuit includes:
  an external input terminal that is configured to receive an external command voltage;
  an addition circuit that is configured to output an added voltage; and
  an addition output terminal to which the added voltage is output,
the power conversion device further comprises:
  a control line that connects the addition output terminal to the two control terminals; and
  a detection line including an inductance, the detection line connecting the two output terminals to each other, and the detection line connecting the output terminals to the addition circuit such that the addition circuit is configured to receive a counter-electromotive force produced by the inductance, and
the addition circuit is configured to receive the counter-electromotive force and the external command voltage, and output the added voltage by adding the counter-electromotive force to the external command voltage.

6. The power conversion device according to claim 5, wherein the detection line is a wiring pattern located on a board.

* * * * *